US009177987B2

(12) United States Patent
Lee et al.

(10) Patent No.: US 9,177,987 B2
(45) Date of Patent: Nov. 3, 2015

(54) BINARY CMOS IMAGE SENSORS, METHODS OF OPERATING SAME, AND IMAGE PROCESSING SYSTEMS INCLUDING SAME

(71) Applicant: Samsung Electronics Co., Ltd., Suwon-Si, Gyeonggi-Do (KR)

(72) Inventors: Tae-Yon Lee, Seoul (KR); Ju Hwan Jung, Seoul (KR); Seok Yong Hong, Seoul (KR); Tae-Chan Kim, Yongin-si (KR); Dong Ki Min, Seoul (KR); Yoon Dong Park, Osan-si (KR); Sang-Chul Sul, Suwon-si (KR); Tae-Seok Oh, Seoul (KR); Je Il Ryu, Seoul (KR); Kwang-Hyun Lee, Seongnam-si (KR); Young-Gu Jin, Osan-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 118 days.

(21) Appl. No.: 14/051,179

(22) Filed: Oct. 10, 2013

(65) Prior Publication Data
US 2014/0103192 A1    Apr. 17, 2014

Related U.S. Application Data

(60) Provisional application No. 61/713,175, filed on Oct. 12, 2012.

(30) Foreign Application Priority Data

Jun. 26, 2013    (KR) .................. 10-2013-0073997

(51) Int. Cl.
H01L 27/00      (2006.01)
H01L 27/146     (2006.01)
H04N 5/376      (2011.01)

(52) U.S. Cl.
CPC ...... *H01L 27/14643* (2013.01); *H01L 27/1464* (2013.01); *H01L 27/14612* (2013.01); *H04N 5/3765* (2013.01)

(58) Field of Classification Search
CPC .................................................. H01L 27/14603
USPC ....................................................... 250/208.1
See application file for complete search history.

(56) References Cited

U.S. PATENT DOCUMENTS

| 5,426,292 A | 6/1995 | Bird et al. |
| 5,461,425 A | 10/1995 | Fowler et al. |
| 6,093,924 A | 7/2000 | Afghahi |
| 6,549,234 B1 | 4/2003 | Lee |

(Continued)

FOREIGN PATENT DOCUMENTS

| JP | 11196338 A | 7/1999 |
| JP | 11205684 A | 7/1999 |

(Continued)

*Primary Examiner* — Thanh Luu
(74) *Attorney, Agent, or Firm* — Harness, Dickey & Pierce, P.L.C.

(57) ABSTRACT

A binary complementary metal-oxide-semiconductor (CMOS) image sensor includes a pixel array and a readout circuit. The pixel array includes at least one pixel having a plurality of sub-pixels. The readout circuit is configured to quantize a pixel signal output from the pixel using a reference signal. The pixel signal corresponds to sub-pixel signals output from sub-pixels, from among the plurality of sub-pixels, activated in response to incident light.

19 Claims, 22 Drawing Sheets

(56) References Cited

U.S. PATENT DOCUMENTS

| | | | |
|---|---|---|---|
| 6,677,993 B1 | 1/2004 | Suzuki et al. | |
| 6,747,700 B1 | 6/2004 | Funakoshi et al. | |
| 6,784,933 B1 | 8/2004 | Nakai | |
| 7,345,269 B2 | 3/2008 | Lee et al. | |
| 7,550,705 B2 | 6/2009 | Seitz et al. | |
| 7,911,512 B2 | 3/2011 | Henderson | |
| 7,920,194 B2 | 4/2011 | Bock | |
| 7,924,332 B2 | 4/2011 | Gruev et al. | |
| 8,102,451 B2 | 1/2012 | Mo et al. | |
| 8,119,972 B2 | 2/2012 | Lotto et al. | |
| 2006/0244843 A1 | 11/2006 | Dierickx | |
| 2009/0294633 A1* | 12/2009 | Seol et al. | 250/208.1 |
| 2009/0310006 A1 | 12/2009 | Sugiyama et al. | |
| 2011/0042573 A1 | 2/2011 | Kim et al. | |
| 2011/0050969 A1 | 3/2011 | Nishihara | |
| 2011/0080510 A1 | 4/2011 | Nishihara | |
| 2011/0128425 A1 | 6/2011 | Schemmann et al. | |
| 2011/0149274 A1 | 6/2011 | Rissa et al. | |
| 2011/0199106 A1 | 8/2011 | Lotto et al. | |
| 2011/0228144 A1 | 9/2011 | Tian et al. | |
| 2012/0001056 A1* | 1/2012 | Fife et al. | 250/208.1 |
| 2012/0001059 A1 | 1/2012 | Ackland | |
| 2012/0026370 A1 | 2/2012 | Oike et al. | |

FOREIGN PATENT DOCUMENTS

| | | |
|---|---|---|
| JP | 2000-196961 A | 7/2000 |
| JP | 2004193675 A | 7/2004 |
| KR | 1998-024164 | 7/1998 |
| KR | 10-0139818 Y1 | 5/1999 |
| KR | 20120053456 A | 5/2012 |

* cited by examiner

BINARY CMOS IMAGE SENSORS, METHODS OF OPERATING SAME, AND IMAGE PROCESSING SYSTEMS INCLUDING SAME

CROSS-REFERENCE TO RELATED APPLICATIONS

This application claims priority under 35 U.S.C. §119 to U.S. provisional patent application No. 61/713,175 filed on Oct. 12, 2012 and to Korean Patent Application No. 10-2013-0073997 filed on Jun. 26, 2013, the entire contents of each of which are hereby incorporated by reference.

BACKGROUND

1. Field

Example embodiments of inventive concepts relate to binary complementary metal-oxide-semiconductor (CMOS) image sensors, and more particularly, to binary CMOS image sensors using photo-conductivity controls or non-volatile memories including a photoelectric conversion regions, methods of operating the same, and image processing systems including the same.

2. Description of Conventional Art

Image sensors are devices that convert an optical image into an electrical signal. Image sensors are classified into charge coupled device (CCD) image sensors and CMOS image sensors.

A conventional 4-transistor active CMOS image sensor is an analog image sensor that generates a signal proportional to the amount of electrons generated in a photoelectric conversion element, e.g., a photodiode. The conventional 4-transistor active CMOS image sensor requires a long integration time to generate the electrons and needs to appropriately control the operations of four transistors in order to suppress thermal noise (e.g., kTC noise).

SUMMARY

According to some example embodiments of inventive concepts, a binary complementary metal-oxide-semiconductor (CMOS) image sensor includes a pixel array and a readout circuit. The pixel array includes at least one pixel having a plurality of sub-pixels. The readout circuit is configured to quantize a pixel signal output from the pixel using a reference signal. The pixel signal corresponds to sub-pixel signals output from sub-pixels, among the plurality of sub-pixels, activated in response to incident light.

Each of the plurality of sub-pixels may have a resistance value determined based on the number of photons generated in response to the incident light.

Each of the plurality of sub-pixels may include an epitaxial layer and a non-volatile memory including a photoelectric conversion region. The photoelectric conversion region may be configured to perform photoelectric conversion in response to incident light that has passed through the epitaxial layer. Alternatively, each of the plurality of sub-pixels may include an epitaxial layer and a floating gate transistor including a photoelectric conversion region configured to perform photoelectric conversion in response to incident light that has passed through the epitaxial layer. As another alternative, each of the plurality of sub-pixels may include an epitaxial layer and a nitride read-only memory (NROM) including a photoelectric conversion region configured to perform photoelectric conversion in response to incident light that has passed through the epitaxial layer.

According to at least some example embodiments, each of the plurality of sub-pixels may include: a photo-conductor and a source region in a semiconductor substrate; a drain region in the photo-conductor; and a gate electrode configured to receive a gate voltage. Each of the plurality of sub-pixels may further include: a first connection line between the readout circuit and the source region; a second connection line connected to the drain region and configured to apply a drain voltage to the drain region; and a third connection line connected to the photo-conductor and configured to apply a program voltage to the photo-conductor.

According to other example embodiments of inventive concepts, there is provided an image processing system. The image processing system includes: a binary CMOS image sensor; and a controller configured to control operation of the binary CMOS image sensor. The binary CMOS image sensor includes a pixel array and a readout circuit. The pixel array includes at least one pixel having a plurality of sub-pixels. The readout circuit is configured to quantize a pixel signal output from the pixel using a reference signal. The pixel signal corresponds to sub-pixel signals output from sub-pixels, among the plurality of sub-pixels, activated in response to incident light.

According to further example embodiments of inventive concepts, there is provided a method of operating a binary CMOS image sensor including a pixel array, which includes at least one pixel having a plurality of sub-pixels. The method includes: generating a pixel signal corresponding to sub-pixel signals output from sub-pixels, from among the plurality of sub-pixels, activated in response to incident light; and quantizing the pixel signal using a reference signal.

The pixel may not include a floating diffusion region. A resistance value of each of the plurality of sub-pixels may be determined based on the number of photons generated in response to the incident light.

At least one other example embodiment provides a binary complementary metal-oxide-semiconductor (CMOS) image sensor including: a readout circuit configured to generate a quantized pixel signal for a pixel including a plurality of sub-pixels based on a comparison between a reference signal and a pixel signal for the pixel, the pixel signal being indicative of a number of sub-pixels, from among the plurality of sub-pixels, activated in response to incident light.

The binary CMOS image sensor may further include a pixel array including the pixel.

The reference signal may correspond to a threshold number of sub-pixels, and the readout circuit may be configured to generate the quantized pixel signal based on a comparison between the number of sub-pixels activated in response to the incident light and the threshold number of sub-pixels.

The plurality of sub-pixels may be connected to a common node, and the readout circuit may further include: a comparator configured to generate a quantized pixel signal based on a comparison between the pixel signal at the common node and the reference signal. The comparator may be configured to generate the quantized pixel signal having a first value if the number of sub-pixels activated in response to the incident light is greater than the threshold number of sub-pixels, but generate the quantized pixel signal having a second value if the number of sub-pixels activated in response to the incident light is less than or equal to the threshold number of sub-pixels.

BRIEF DESCRIPTION OF THE DRAWINGS

The above and other features and advantages of inventive concepts will become more apparent by describing in detail example embodiments thereof with reference to the attached drawings in which.

DETAILED DESCRIPTION

Figure 1:
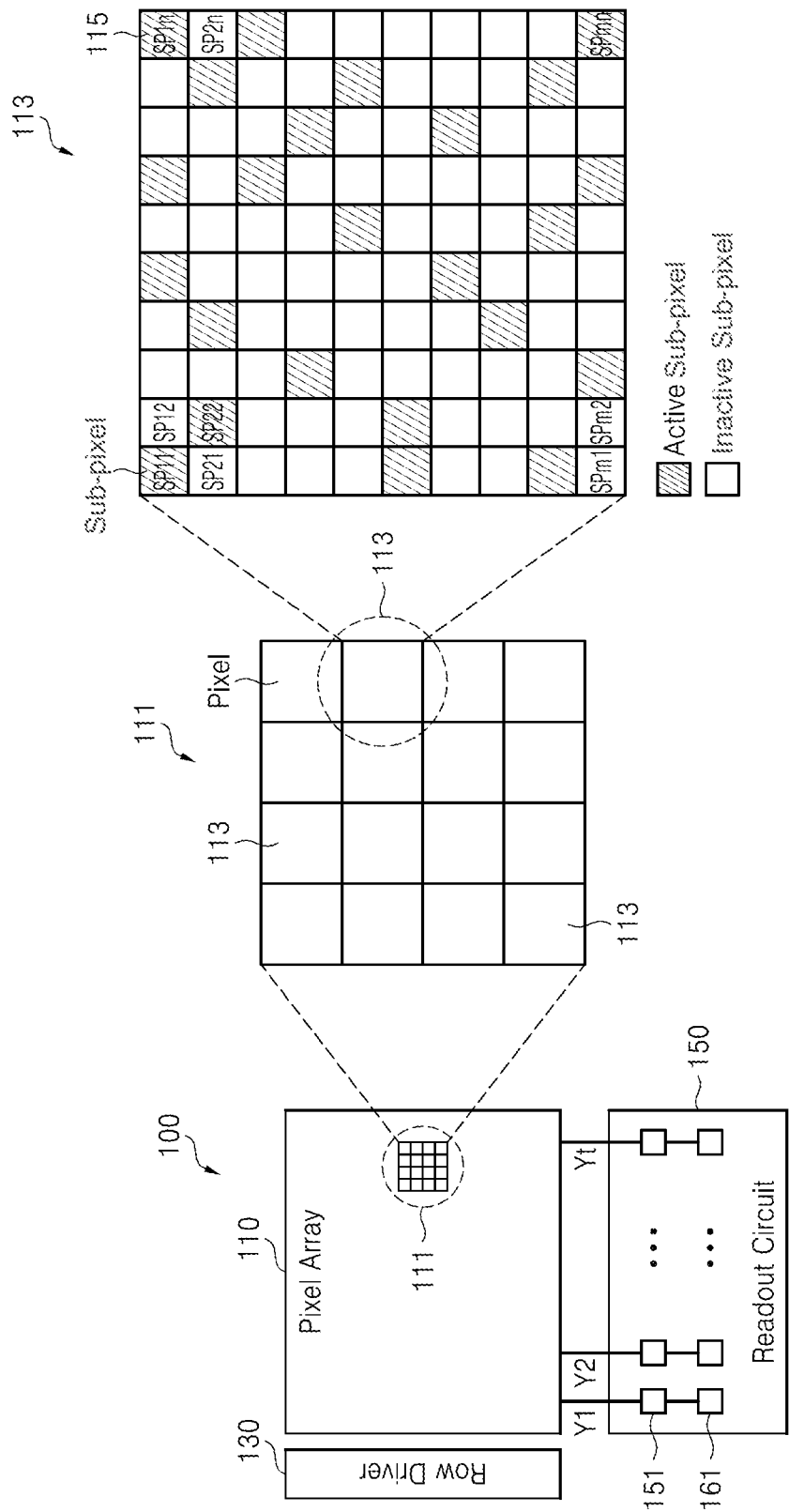
FIG. 1 is a block diagram of a complementary metal-oxide-semiconductor (CMOS) image sensor including a pixel array including a pixel having sub-pixels according to some example embodiments of inventive concepts.

Inventive concepts now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a complementary metal-oxide-semiconductor (CMOS) image sensor 100 including a pixel array 110 including a pixel 113 having sub-pixels 115 according to some example embodiments of inventive concepts. The CMOS image sensor 100 includes a pixel array 110, a row driver 130, and a readout circuit 150.

The pixel array 110 includes a plurality of pixels 113 each of which includes a plurality of sub-pixels 115. A set 111 of the pixels 113, i.e., the pixel set 111, is included in the pixel array 110 and each pixel 113 includes a plurality of the sub-pixels 115.

The sub-pixels 115 may be activated or deactivated in response to incident light. Here, activation means that the sub-pixels 115 perform particular operations, such as photoelectric conversion and signal transmission, in response to incident light; and deactivation means that the sub-pixels 115 do not perform the particular operations in response to the incident light.

Some of the sub-pixels 115 included in the pixel 113 may perform a particular operation in response to incident light while the rest of the sub-pixels 115 may not perform the particular operation in response to the incident light.

The pixel 113 may generate a pixel signal corresponding to sub-pixel signals output from some sub-pixels 115 activated in response to the incident light among all of the sub-pixels 115 included in the pixel 113.

The row driver 130 may control the operations of the pixel array 110, the pixels 113, and the sub-pixels 115.

The readout circuit 150 includes a plurality of comparators 151. Each of the comparators 151 may quantize a pixel signal output from a corresponding pixel 113 using a reference signal and output a quantized signal. Each comparator 151 may be connected to one of column lines Y1 through Yt where "t" is a natural number. The quantized signal output from the comparator 151 may be stored in a corresponding memory 161.

Figure 2:
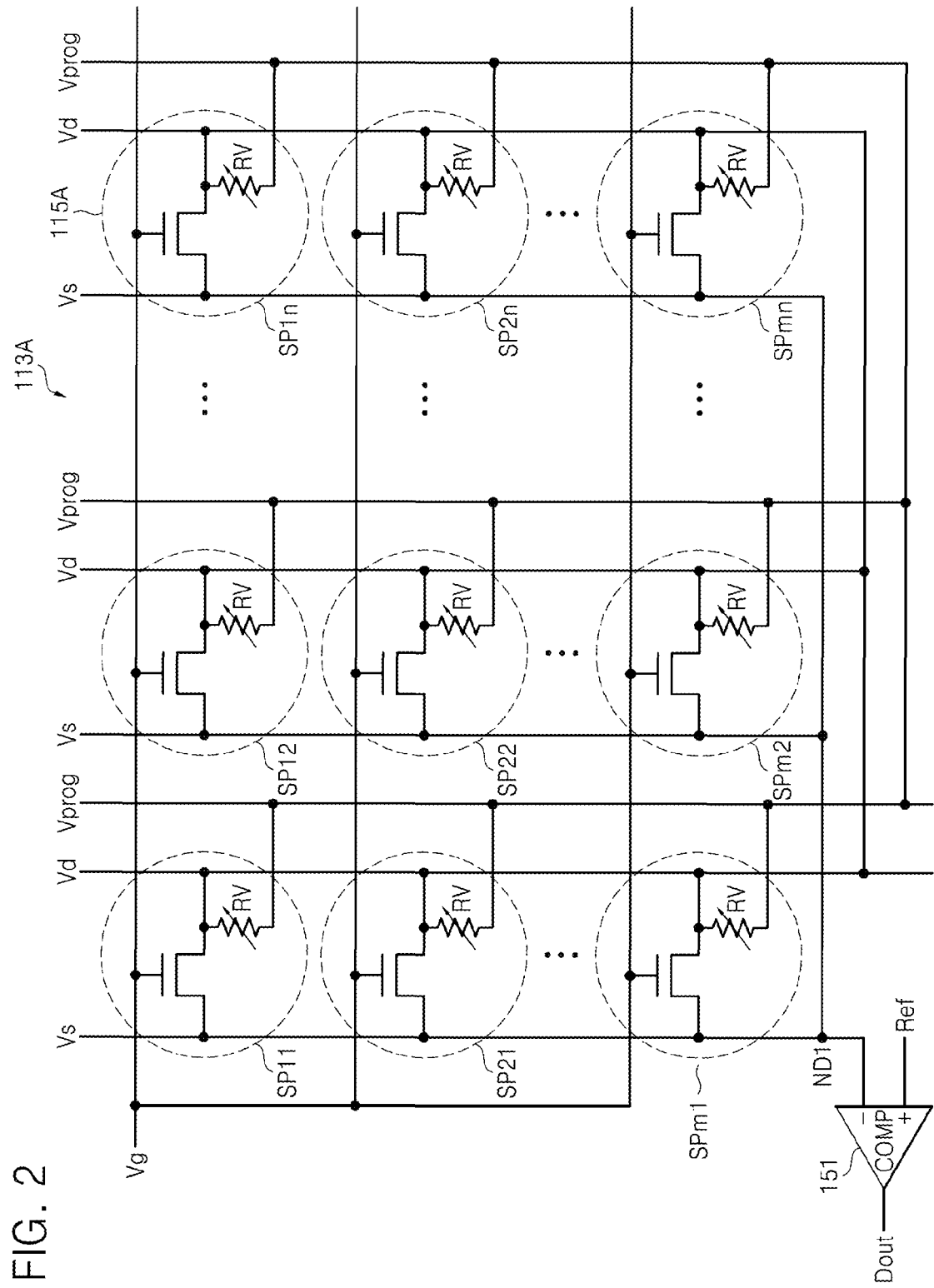
FIG. 2 is a circuit diagram of the pixel including the sub-pixels illustrated in FIG. 1 according to some example embodiments of inventive concepts.
Figure 3:
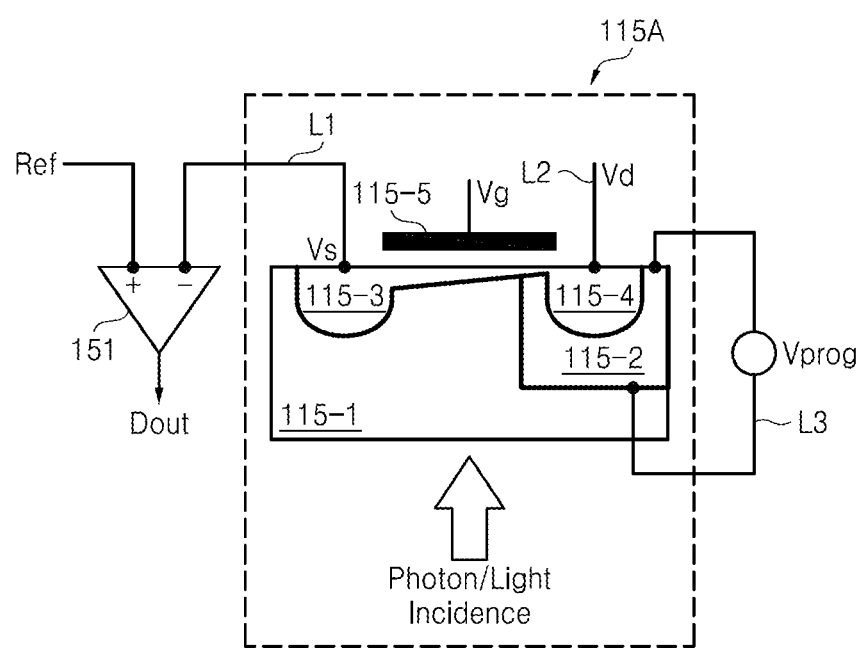
FIG. 3 is a schematic diagram of the structure of a sub-pixel illustrated in FIG. 2 according to some example embodiments of inventive concepts.

FIG. 2 is a circuit diagram of a pixel 113A including the sub-pixels 115 illustrated in FIG. 1 according to some example embodiments of inventive concepts. FIG. 3 is a schematic diagram of the structure of a sub-pixel 115A illustrated in FIG. 2. Referring to FIGS. 1 through 3, the pixel 113A includes a plurality of sub-pixels SP11 through SPmn where "m" and "n" are natural numbers and m=n or m≠n.

An example of the sub-pixel 115, i.e., the sub-pixel 115A, includes a semiconductor substrate 115-1, a photo-conductor 115-2 formed in the semiconductor substrate 115-1, a source region 115-3 formed in the semiconductor substrate 115-1, a drain region 115-4 formed in the photo-conductor 115-2, and a gate electrode 115-5 receiving a gate voltage Vg.

For clarity of the description, a comparator 151 is illustrated together with the sub-pixel 115A in FIG. 3. The sub-pixel 115A including the photo-conductor 115-2 may be implemented by an n-channel MOS (NMOS) transistor or a p-channel MOS (PMOS) transistor.

The comparator 151 of the readout circuit 150 and the source region 115-3 are connected with each other through a first connection line L1. A drain voltage Vd is applied to the drain region 115-4 through a second connection line L2. A program voltage Vprog is applied to both terminals of the photo-conductor 115-2 through a third connection line L3. Here, the connection lines L1, L2, and L3 are examples of an electrical connections.

A photon or incident light is provided to the semiconductor substrate 115-1. The photo-conductor 115-2 may be formed of cadmium sulfide (CdS), cadmium telluride (CdTe), a cadmium selenide (CdSe), sulfide (S), selenide (Se), telluride (Te), or the like. The photo-conductor 115-2 may function as a photon switch.

A resistance value of each of the sub-pixels SP11 through SPmn is determined based on the number of photons generated in response to the incident light.

Referring to FIG. 2, the photo-conductor 115-2 may be represented with a variable resistor RV. The sub-pixels SP11 through SPmn each may function as a resistance element operating in response to the incident light. Accordingly, the readout circuit 150 including the comparator 151 may detect a subtle change in resistance of the pixel 113.

A source voltage Vs is applied to the source region 115-3 in each of the sub-pixels SP11 through SPmn. The drain voltage Vd is applied to the drain region 115-4 in each of the sub-pixels SP11 through SPmn. The program voltage Vprog is applied to the photo-conductor 115-2 in each of the sub-pixels SP11 through SPmn. The gate voltage Vg is applied to the gate 115-5 in each of the sub-pixels SP11 through SPmn.

The comparator 151 compares a signal of a common node ND1, to which the source regions 115-3 of the respective sub-pixels SP11 through SPmn are connected in common, with a reference signal Ref and outputs a comparison signal Dout corresponding to the comparison result. In other words, the comparator 151 quantizes the signal of the common node ND1, i.e., a pixel signal, using the reference signal Ref and outputs the quantized signal Dout. The reference signal Ref may be a reference current or a reference voltage. Therefore, the comparator 151 may be implemented by a current comparator or a voltage comparator.

For clarity of the description, it is assumed that the pixel 113 or 113A includes 100 sub-pixels 115 or 115A and the reference signal Ref is the same as a pixel signal corresponding to sub-pixel signals output from 50 sub-pixels activated in response to incident light among 100 sub-pixels 115 or 115A.

When a first range of sub-pixel(s), for example from 0 to 50 sub-pixels are activated in response to incident light, the comparator 151 outputs the quantized comparison signal Dout at a low level (or corresponding to data "0"). However, when a second range of sub-pixels, for example from 51 to 100 sub-pixels are activated in response to the incident light, the comparator 151 outputs the quantized comparison signal Dout at a high level (or corresponding to data "1").

Unlike a conventional analog CMOS image sensor that outputs a pixel signal proportional to the amount of electrons generated in a photoelectric conversion element, the CMOS image sensor 100 according at least the current example embodiments outputs a quantized signal based on the reference signal Ref and a pixel signal corresponding to the number of sub-pixels activated in the pixel 113 or 113A. The CMOS image sensor 100 performing such an operation is referred to as a binary CMOS image sensor.

Figure 4:
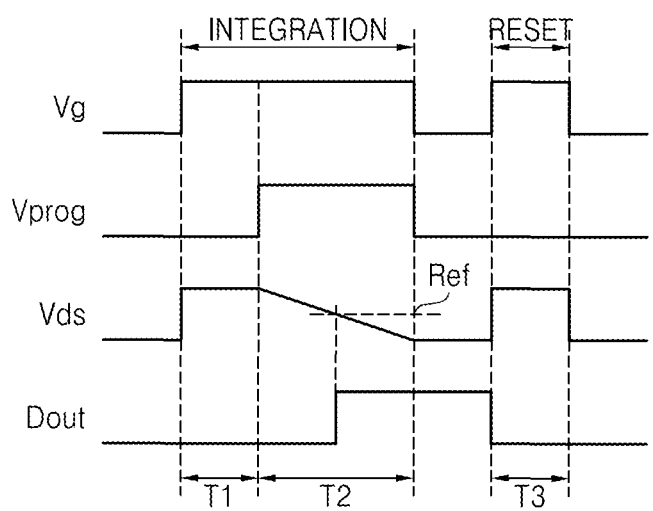
FIG. 4 is an example timing chart of signals related with the operation of the sub-pixel illustrated in FIG. 3.

FIG. 4 is a timing chart of signals related with the operation of the sub-pixel 115A illustrated in FIG. 3. Referring to FIGS. 3 and 4, it is assumed that the semiconductor substrate 115-1 is doped with n-type impurities; the photo-conductor 115-2, the source region 115-3, and the drain region 115-4 are doped with p-type impurities; an impurity concentration in the photo-conductor 115-2 is lower than an impurity concentration in the regions 115-3 and 115-4; and a photon or incident light is input through the bottom of the semiconductor substrate 115-1.

During a first interval T1, the gate voltage Vg and a drain-source voltage Vds are higher than 0 and the program voltage Vprog is 0, and therefore, a p-channel remains in an on-state, i.e., a reset state.

During a second interval T2, when the program voltage Vprog is applied to the photo-conductor 115-2, photocurrent is injected to the drain region 115-4, and therefore, the drain-source voltage Vds decreases. When the drain-source voltage Vds decreases continuously, the p-channel is turned off.

The comparator 151 compares a signal output from the source region 115-3 with the reference signal Ref and outputs the comparison signal Dout according to the comparison result. In other words, during the first and second intervals T1 and T2, i.e., during an integration interval, photons are generated in the semiconductor substrate 115-1. During a third interval T3, a reset operation is performed.

Figure 5:
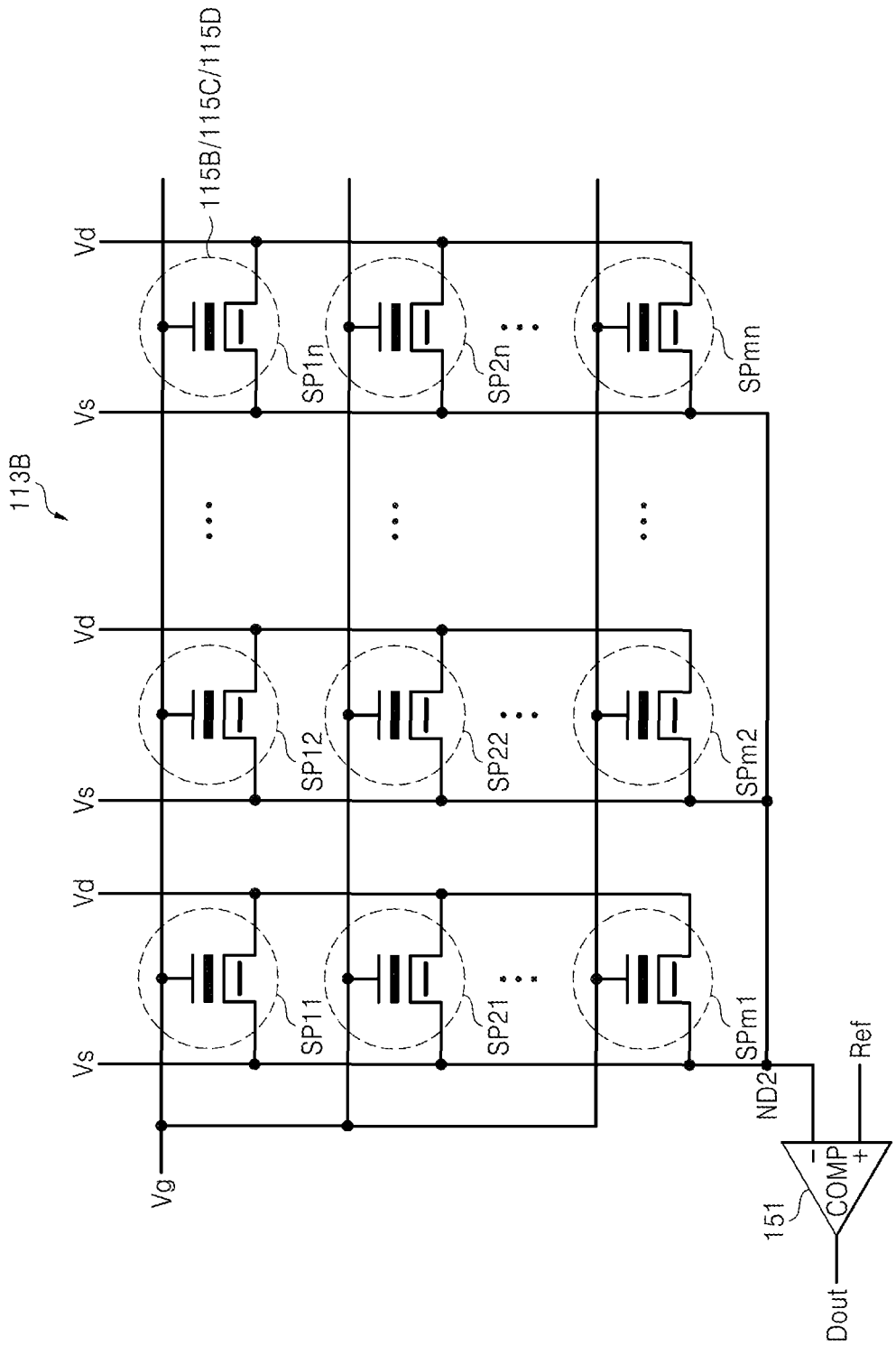
FIG. 5 is a circuit diagram of the pixel including the sub-pixels illustrated in FIG. 1 according to other example embodiments of inventive concepts.
Figure 6:
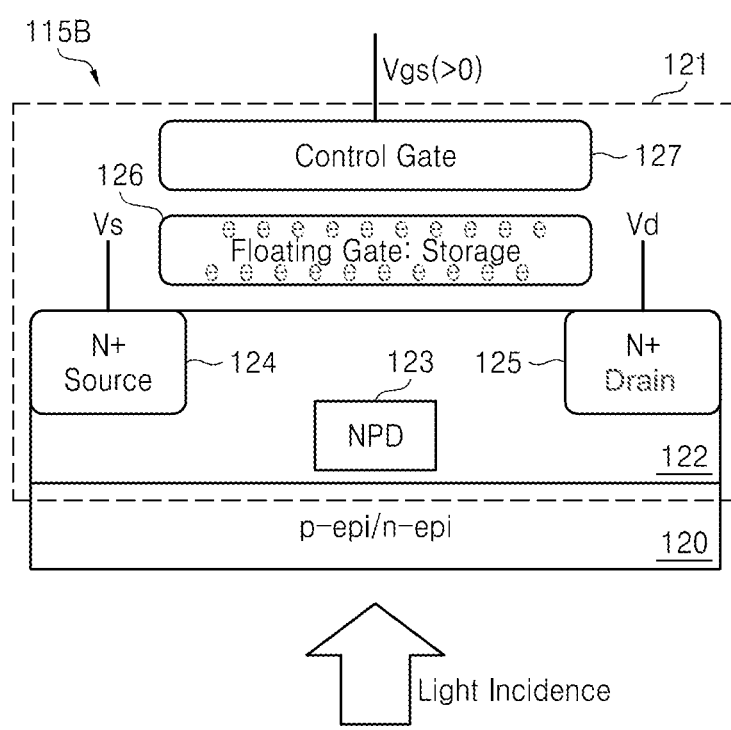
FIG. 6 is a conceptual diagram for explaining example structure and integration operation of a sub-pixel illustrated in FIG. 5.

FIG. 5 is a circuit diagram of a pixel 113B including the sub-pixels 115 illustrated in FIG. 1 according to other example embodiments of inventive concepts. FIG. 6 is a conceptual diagram for explaining the structure and the integration operation of a sub-pixel 115B illustrated in FIG. 5.

Referring to FIGS. 1, 5, and 6, another example of a sub-pixel 115 illustrated in FIG. 1, i.e., the sub-pixel 115B includes an epitaxial layer 120 and a non-volatile memory, e.g., a floating gate transistor, 121 including a photoelectric conversion region 123 performing photoelectric conversion in response to light incident through the epitaxial layer 120.

The floating gate transistor 121 may be implemented as a NAND flash memory or a NOR flash memory. The floating gate transistor 121 may store information of 1 bit or more. The epitaxial layer 120 may be doped with p-type or n-type impurities.

The floating gate transistor 121 may be implemented by an n-channel floating gate transistor including the photoelectric conversion region 123 or a p-channel floating gate transistor including the photoelectric conversion region 123. The photoelectric conversion region 123 may be doped with p-type or n-type impurities.

For example, the floating gate transistor 121 includes a semiconductor substrate 122 doped with p-type impurities, the photoelectric conversion region 123 formed in the semiconductor substrate 122 and doped with n-type impurities, a source region 124 formed in the semiconductor substrate 122 and doped with n-type impurities, and a drain region 125 formed in the semiconductor substrate 122 and doped with n-type impurities. The photoelectric conversion region 123 formed in the semiconductor substrate 122 may function as a photodiode.

The floating gate transistor 121 also includes a floating gate 126 formed over the semiconductor substrate 122, a control gate 127 formed over the floating gate 126, a first insulation layer formed between the semiconductor substrate 122 and the floating gate 126, and a second insulation layer formed between the floating gate 126 and the control gate 127.

As shown in FIG. 5, the source voltage Vs is applied to the source region 124 in each of the sub-pixels SP11 through SPmn, the drain voltage Vd is applied to the drain region 125 in each of the sub-pixels SP11 through SPmn, and the gate voltage Vg is applied to the control gate 127 in each of the sub-pixels SP11 through SPmn.

The comparator 151 compares a signal at a common node ND2, to which the source regions 124 of the respective sub-pixels SP11 through SPmn are connected in common, with the reference signal Ref and outputs the comparison signal Dout corresponding to the comparison result. In other words, the comparator 151 quantizes the signal at the common node ND2, i.e., a pixel signal, using the reference signal Ref and outputs the quantized signal Dout.

For clarity of the description, it is assumed that the pixel 113B includes 100 sub-pixels 115B and the reference signal Ref is the same as a pixel signal corresponding to sub-pixel signals output from 50 sub-pixels activated in response to incident light among 100 sub-pixels 115B.

When a first range of sub-pixel(s), for example from 0 to 50 sub-pixels are activated in response to incident light, the comparator 151 outputs the quantized comparison signal Dout corresponding to data "0". However, when a second range of sub-pixels, for example from 51 to 100 sub-pixels are activated in response to the incident light, the comparator 151 outputs the quantized comparison signal Dout corresponding to data "1".

Unlike a conventional analog CMOS image sensor that outputs a pixel signal proportional to the amount of electrons generated in a photoelectric conversion element, the CMOS image sensor 100 according to at least the current example embodiments outputs a quantized signal based on the reference signal Ref and a pixel signal corresponding to the number of sub-pixels activated in the pixel 113B.

As shown in FIG. 6, when the voltage Vgs between the control gate 127 and the source region 124 is higher than 0 during an integration operation or a program operation, electrons move from the semiconductor substrate 122 to the floating gate 126, i.e., storage.

Figure 7:
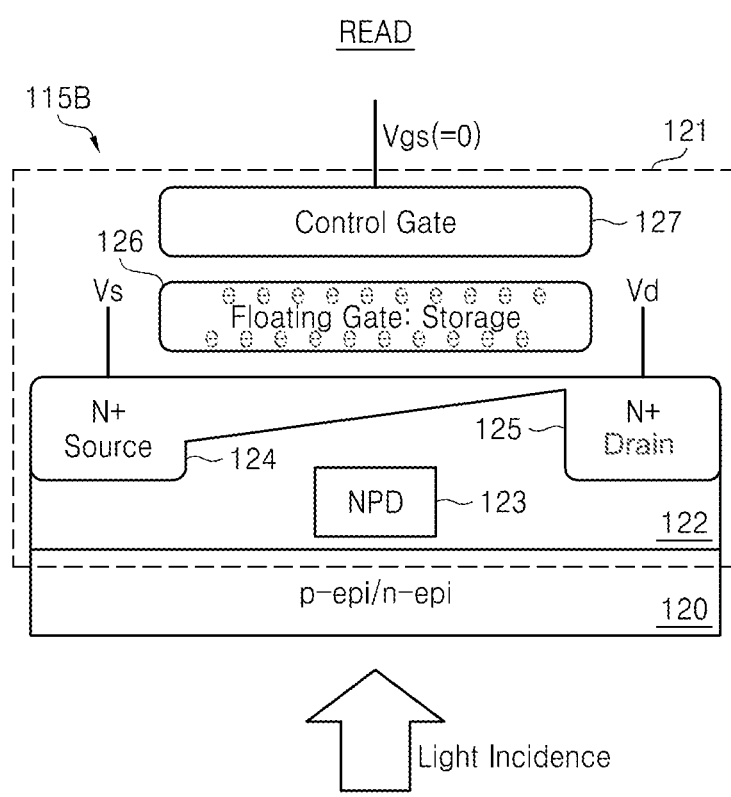
FIG. 7 is a conceptual diagram for explaining example structure and read operation of the sub-pixel illustrated in FIG. 5.

FIG. 7 is a conceptual diagram for explaining the structure and the read operation of the sub-pixel 115B illustrated in FIG. 5. As shown in FIG. 7, the voltage Vgs between the control gate 127 and the source region 124 becomes 0 for a read operation.

Figure 8:
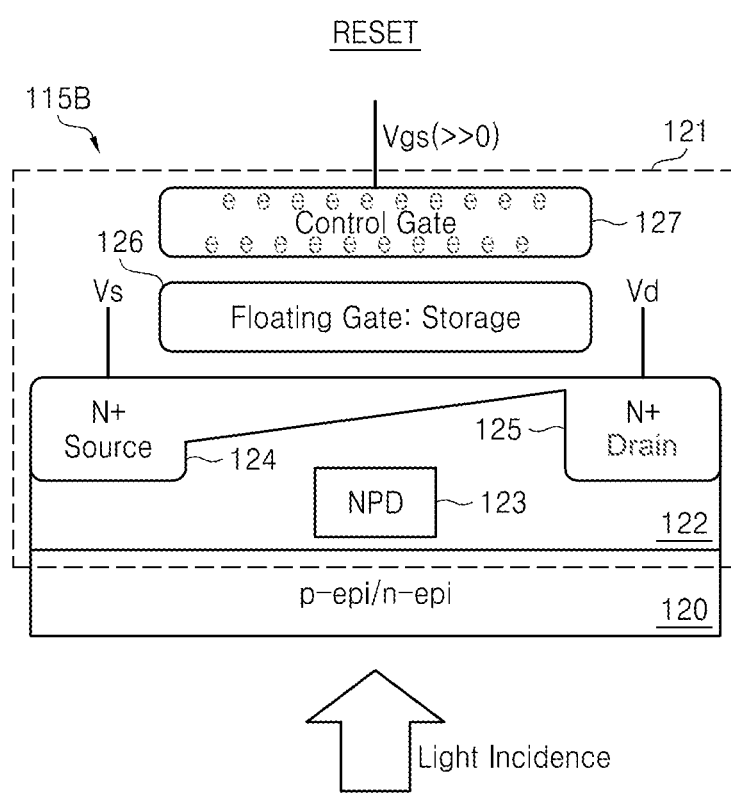
FIG. 8 is a conceptual diagram for explaining example structure and reset operation of the sub-pixel illustrated in FIG. 5.

FIG. 8 is a conceptual diagram for explaining the structure and the reset operation of the sub-pixel 115B illustrated in FIG. 5. As shown in FIG. 8, the voltage Vgs between the control gate 127 and the source region 124 becomes very high for a reset operation or an erase operation.

Referring to FIGS. 6 through 8, what voltage will be applied to each of the source region 124, the drain region 125, and the control gate 127 for the integration operation, the read operation, or the reset operation may vary with the design specification of the sub-pixel 115B.

For instance, when the floating gate transistor 121 is implemented as a NOR flash memory, the integration operation INTEGRATION may be performed using a channel-hot-electron (CHE) programming process and the reset operation RESET may be performed using a Fowler-Nordheim (FN) tunneling process. When the floating gate transistor 121 is implemented as a NAND flash memory, the integration operation INTEGRATION and the reset operation RESET may be performed using the FN tunneling process.

Figure 9:
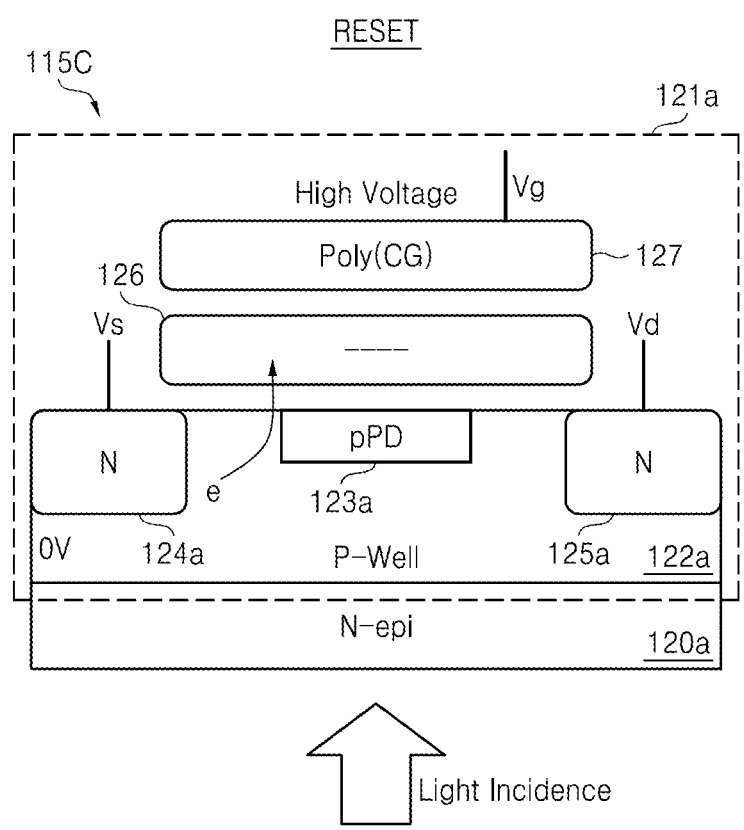
FIGS. 9 through 14 are conceptual diagrams for explaining example structures and operations of the sub-pixel illustrated in FIG. 5.

FIGS. 9 through 14 are conceptual diagrams for explaining the structures and the operations of a sub-pixel 115C illustrated in FIG. 5. Referring to FIGS. 5 and 9, another example of the sub-pixel 115 illustrated in FIG. 1, i.e., the sub-pixel 115C, includes an epitaxial layer 120a and a non-volatile memory, e.g., a floating gate transistor, 121a including a photoelectric conversion region 123a performing photoelectric conversion in response to light incident through the epitaxial layer 120a. The floating gate transistor 121a may be implemented as a NAND flash memory or a NOR flash memory. The epitaxial layer 120a may be doped with n-type impurities.

The floating gate transistor 121a includes a semiconductor substrate 122a doped with p-type impurities, the photoelectric conversion region 123a formed in the semiconductor substrate 122a and doped with p-type impurities, a source region 124a formed in the semiconductor substrate 122a and doped with n-type impurities, and a drain region 125a formed in the semiconductor substrate 122a and doped with n-type impurities. The photoelectric conversion region 123a formed in the semiconductor substrate 122a may function as a photodiode.

The floating gate transistor 121a also includes the floating gate 126 formed over the semiconductor substrate 122a, the control gate 127 formed over the floating gate 126, a first insulation layer formed between the semiconductor substrate 122a and the floating gate 126, and a second insulation layer formed between the floating gate 126 and the control gate 127. The control gate 127 may be formed of poly silicon or metal.

As shown in FIG. 5, the source voltage Vs is applied to the source region 124a in each of the sub-pixels SP11 through SPmn, the drain voltage Vd is applied to the drain region 125a in each of the sub-pixels SP11 through SPmn, and the gate voltage Vg is applied to the control gate 127 in each of the sub-pixels SP11 through SPmn.

As shown in FIG. 9, during the reset operation RESET, the gate voltage Vg of a high level is applied to the control gate 127 and the source region 124a and the drain region 125a are in a floating state.

Figure 10:
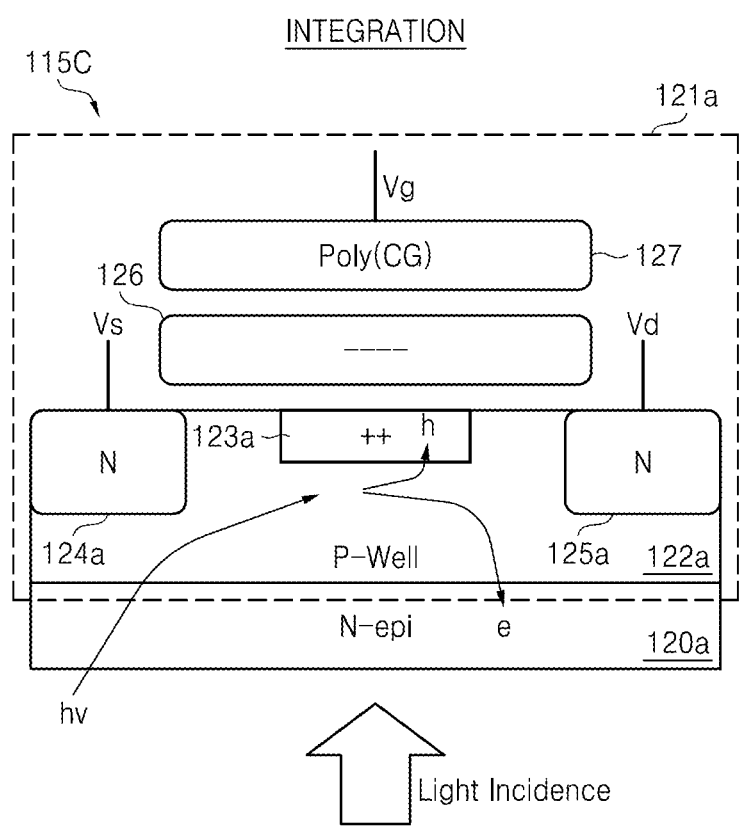

As shown in FIG. 10, during the integration operation INTEGRATION, the gate voltage Vg of a positive level is applied to the control gate 127 and a ground voltage (e.g., 0 V) is applied to the source region 124a and the drain region 125a. At this time, holes "h" generated in the semiconductor substrate 122a move to the photoelectric conversion region 123a and electrons "e" generated in the semiconductor substrate 122a move to the epitaxial layer 120a due to an energy hv of photons.

Figure 11:
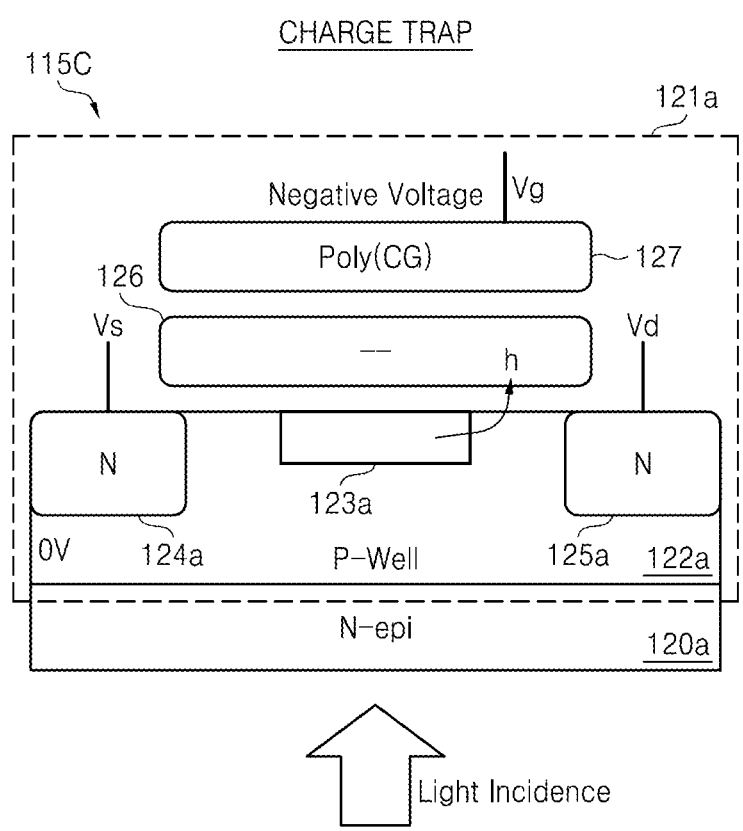

As shown in FIG. 11, during a charge trap CHARGE TRAP, the gate voltage Vg of a negative level is applied to the control gate 127 and the source region 124a and the drain region 125a are in the floating state. At this time, the holes "h" move from the photoelectric conversion region 123a to the floating gate 126.

Figure 12:
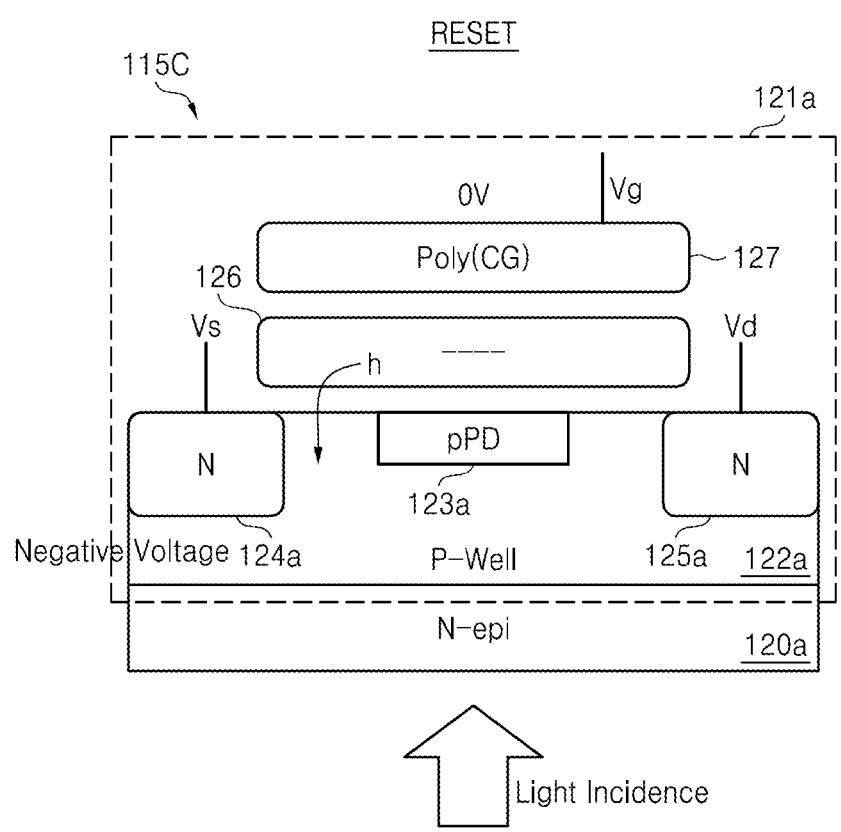

As shown in FIG. 12, during the reset operation RESET, the gate voltage Vg of 0 V is applied to the control gate 127 and the source region 124a and the drain region 125a are in the floating state.

Figure 13:
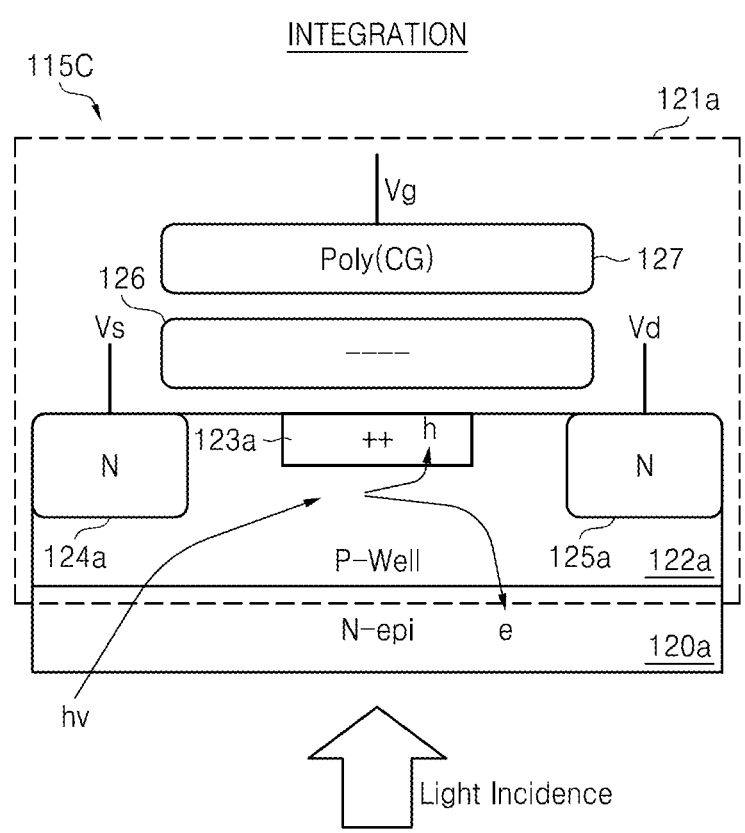

As shown in FIG. 13, during the integration operation INTEGRATION, the gate voltage Vg of a positive level is applied to the control gate 127 and the ground voltage (e.g., 0 V) is applied to the source region 124a and the drain region 125a. At this time, the holes "h" generated in the semiconductor substrate 122a move to the photoelectric conversion region 123a and the electrons "e" generated in the semiconductor substrate 122a move to the epitaxial layer 120a due to the energy hv of photons.

Figure 14:
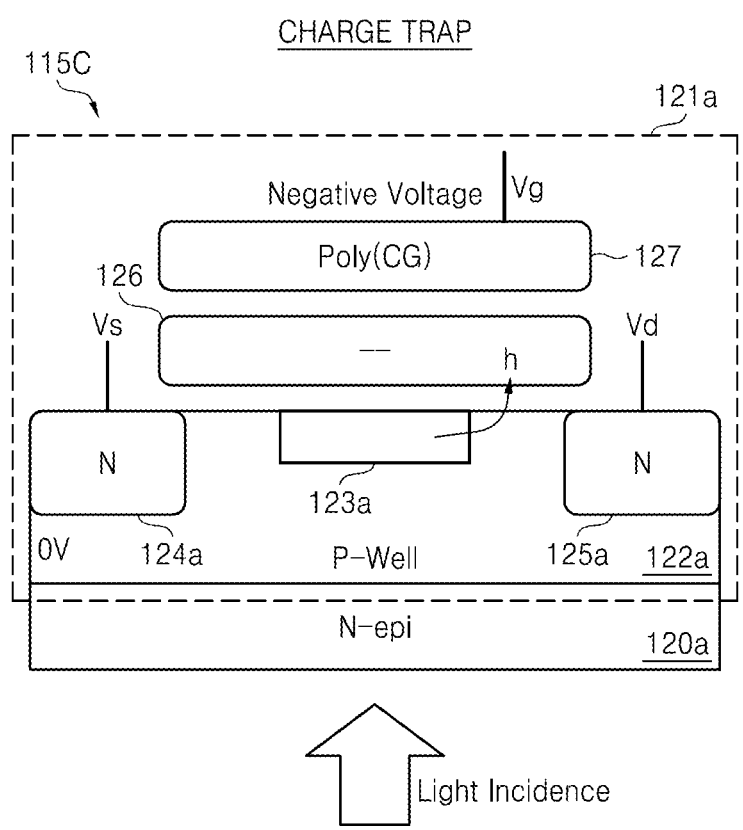

As shown in FIG. 14, during the charge trap CHARGE TRAP, the gate voltage Vg of a negative level is applied to the control gate 127 and the source region 124a and the drain region 125a are in the floating state. At this time, the holes "h" move from the photoelectric conversion region 123a to the floating gate 126.

In the above description with reference to FIGS. 9 through 14, the gate voltage Vg applied to the control gate 127, the voltage Vs applied to the source region 124 or the state of the source region 124a, and the voltage Vd applied to the drain region 125a or the state of the drain region 125a have been explained as examples, and inventive concepts are not restricted to these examples.

Figure 15:
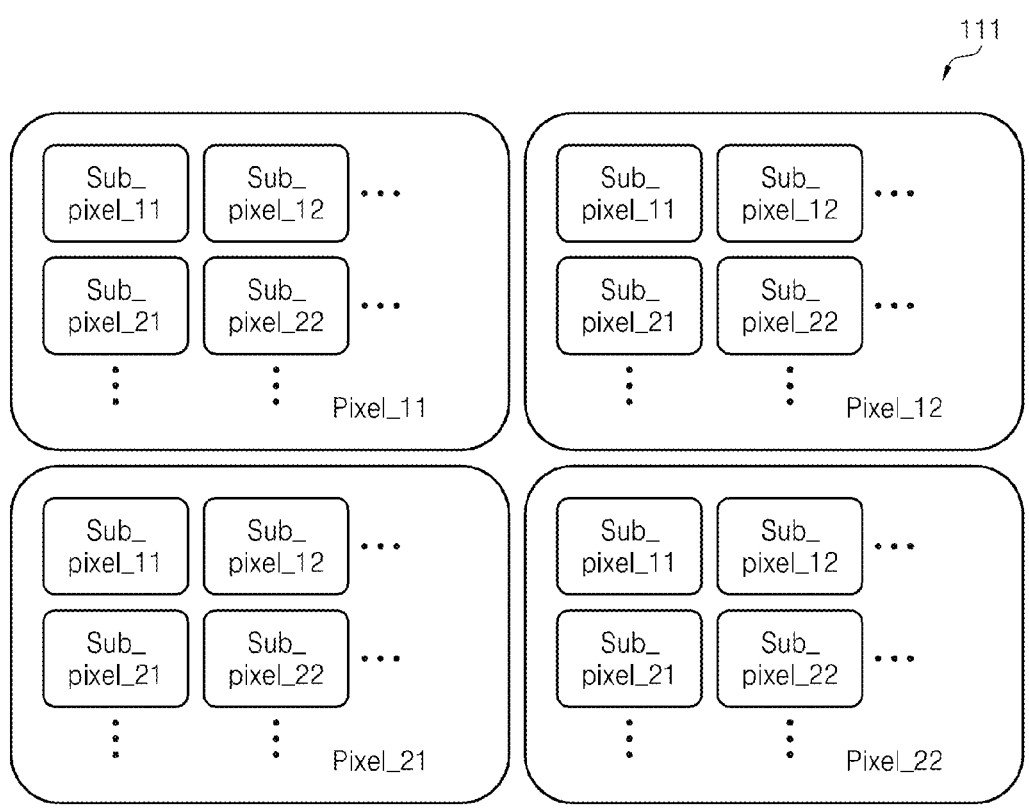
FIG. 15 is a diagram of the pixel array illustrated in FIG. 1 which includes pixels including sub-pixels.
Figure 16:
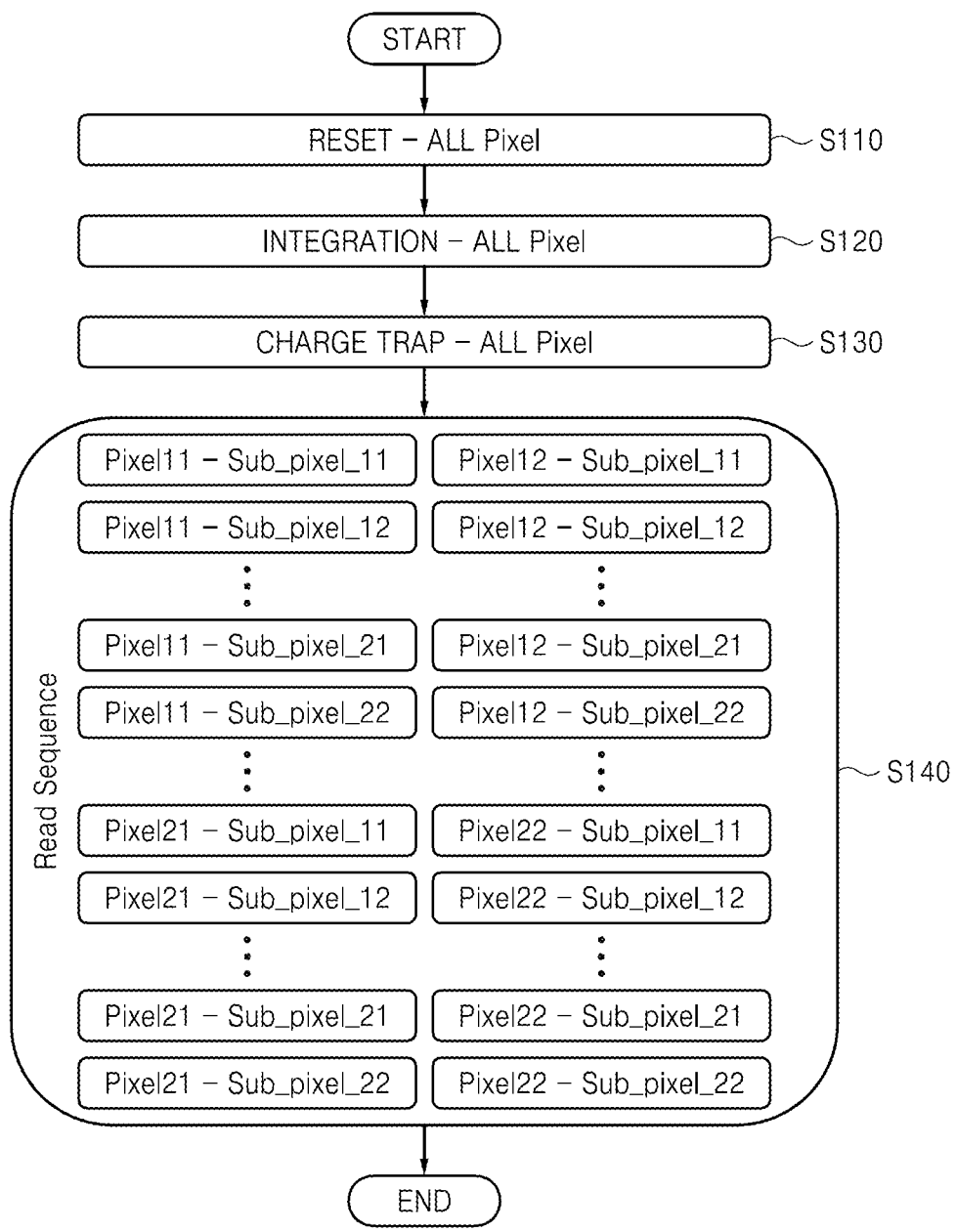
FIG. 16 is a flowchart illustrating example operations of the pixel array illustrated in FIG. 15.
Figure 17:
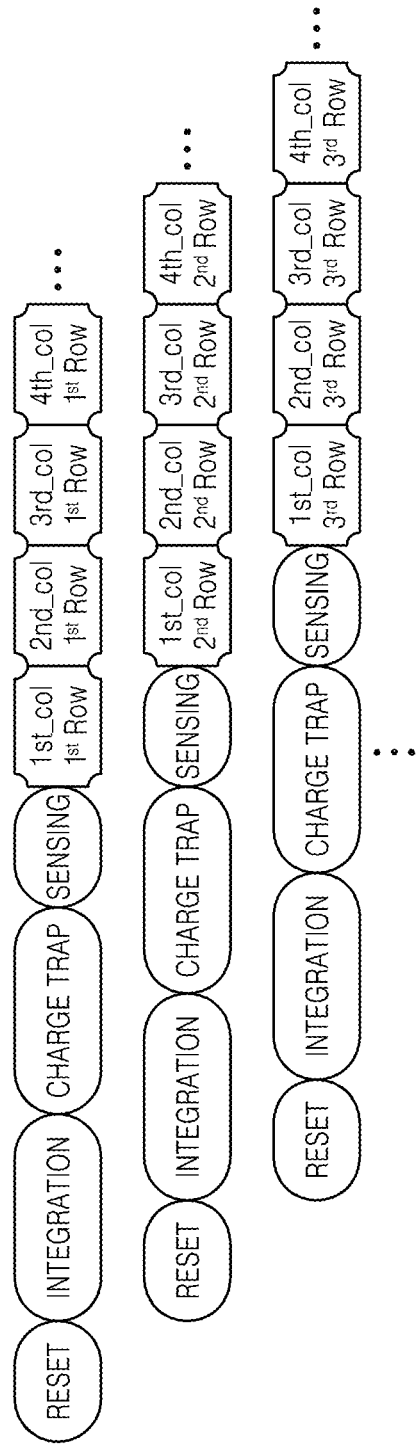
FIG. 17 is an example timing chart showing the operations of the pixel array illustrated in FIG. 15.

FIG. 15 is a diagram of the pixel set 111 illustrated in FIG. 1. FIG. 16 is a flowchart of the operations of the pixel set 111 illustrated in FIG. 15. FIG. 17 is a timing chart showing the operations of the pixel set 111 illustrated in FIG. 15.

Referring to FIGS. 1 and 15, the pixel set 111 includes a plurality of pixels pixel_11, pixel_12, pixel_21, and pixel_22. Each of the pixels pixel_11, pixel_12, pixel_21, and pixel_22 includes a plurality of sub-pixels Sub_pixel_11, Sub_pixel_12, . . . , Sub_pixel_21, Sub_pixel_22, . . . .

Referring to FIG. 16, the reset operation RESET, the integration operation INTEGRATION, and the charge trap CHARGE TRAP are sequentially performed on all pixels (and all sub-pixels) in operations S110, S120, and S130. The read operation is performed on each column in operation S140.

Referring to FIGS. 16 and 17, the reset operation RESET, the integration operation INTEGRATION, the charge trap CHARGE TRAP, and a sensing operation SENSING are sequentially performed, so that columns in a first row are sequentially subjected to the read operation.

The reset operation RESET, the integration operation INTEGRATION, the charge trap CHARGE TRAP, and the sensing operation SENSING are sequentially performed, so that columns in a second row are sequentially subjected to the read operation. Such operation is continued until columns in the last row are sequentially subjected to the read operation.

At this time, a pixel signal corresponding to sub-pixel signals output from sub-pixels activated in response to incident light among the sub-pixels Sub_pixel_11, Sub_pixel_12, . . . , Sub_pixel_21, Sub_pixel_22, . . . included in each of the pixels pixel_11, pixel_12, pixel_21, and pixel_22 is transmitted to a corresponding comparator 151 through a corresponding column line.

Times for integration operation INTEGRATION for the respective rows are the same as one another. Accordingly, global shutter noise is eliminated.

Figure 18:
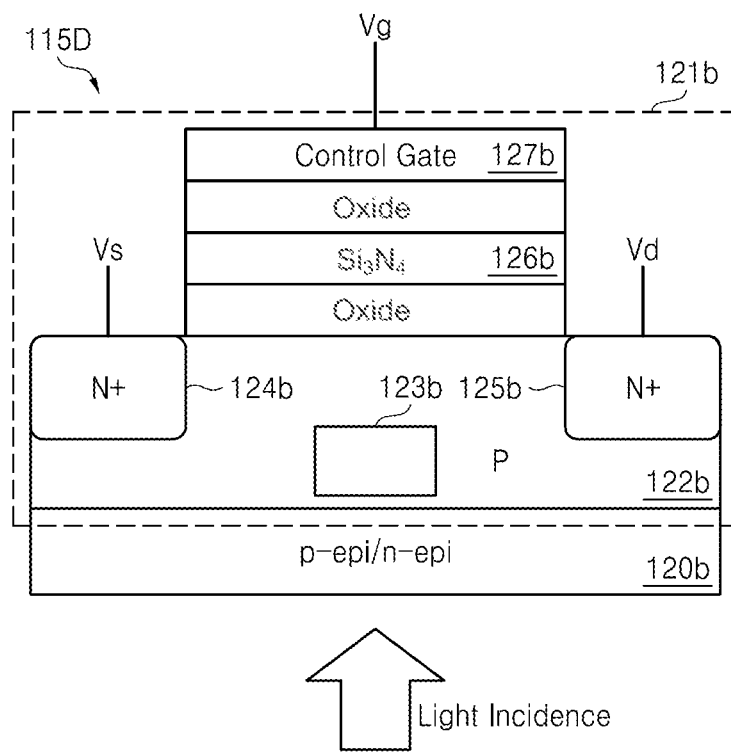
FIG. 18 is a diagram of the structure of a sub-pixel according to other example embodiments of inventive concepts.

FIG. 18 is a diagram of the structure of a sub-pixel 115D according to other example embodiments of inventive concepts.

Referring to FIGS. 1, 5, and 18, another example of the sub-pixel 115 illustrated in FIG. 1, i.e., the sub-pixel 115D, includes an epitaxial layer 120b and a non-volatile memory, e.g., a nitride read-only memory (NROM), 121b including a photoelectric conversion region 123b performing photoelectric conversion in response to light incident through the epitaxial layer 120b. The epitaxial layer 120b may be doped with p-type or n-type impurities.

The NROM 121b may be implemented by an n-channel NROM including the photoelectric conversion region 123b or a p-channel NROM including the photoelectric conversion region 123b. The photoelectric conversion region 123b may be doped with p-type or n-type impurities.

For example, the NROM 121b includes a semiconductor substrate 122b doped with p-type impurities, the photoelectric conversion region 123b formed in the semiconductor substrate 122b and doped with n-type impurities, a source region 124b formed in the semiconductor substrate 122b and doped with n-type impurities, and a drain region 125b formed in the semiconductor substrate 122b and doped with n-type impurities. The photoelectric conversion region 123b formed in the semiconductor substrate 122b may function as a photodiode.

The NROM 121b also includes an oxide-nitride-oxide (ONO) layer 126b formed over the semiconductor substrate 122b, a control gate 127b formed over the ONO layer 126b, a first insulation layer formed between the semiconductor substrate 122b and the ONO layer 126b, and a second insulation layer formed between the ONO layer 126b and the control gate 127b. For example, the ONO layer 126b may be formed of $Si_3N_4$.

As shown in FIG. 5, the source voltage Vs is applied to the source region 124b in each of the sub-pixels SP11 through SPmn, the drain voltage Vd is applied to the drain region 125b in each of the sub-pixels SP11 through SPmn, and the gate voltage Vg is applied to the control gate 127b in each of the sub-pixels SP11 through SPmn.

The comparator 151 compares a signal of the common node ND2, to which the source regions 124b of the respective sub-pixels SP11 through SPmn are connected in common, with the reference signal Ref and outputs the comparison signal Dout corresponding to the comparison result. In other words, the comparator 151 quantizes the signal of the common node ND2, i.e., a pixel signal, using the reference signal Ref and outputs the quantized signal Dout.

For example, the integration operation of the NROM 121b may be performed using the CHE programming process and the reset operation of the NROM 121b may be performed using a band-to-band hot hole injection (BBHHI) process.

Figure 19:
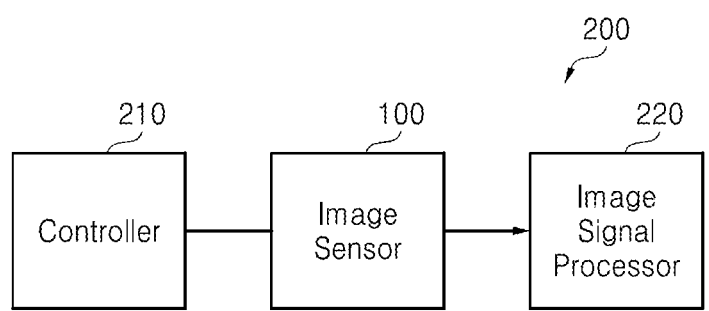
FIG. 19 is a block diagram of an image processing system including the CMOS image sensor illustrated in FIG. 1 according to some example embodiments of inventive concepts.

FIG. 19 is a block diagram of an image processing system 200 including the CMOS image sensor 100 illustrated in FIG. 1 according to some example embodiments of inventive concepts.

Referring to FIGS. 1 through 19, the image processing system 200 includes the binary CMOS image sensor 100, a controller 210, and an image signal processor 220.

The image processing system 200 may be embedded in a portable electronic device. The portable electronic device may be a laptop computer, a mobile telephone, a smart phone, a tablet personal computer (PC), a personal digital assistant (PDA), an enterprise digital assistant (EDA), a digital still camera, a digital video camera, a portable multimedia player (PMP), a personal navigation device or portable navigation device (PND), or a mobile internet device (MID).

The controller 210 may control the operation of the binary CMOS image sensor 100. The controller 210 signifies any integrated circuit that can control the operation of the binary CMOS image sensor 100. The controller 210 may be a processor or an application processor. The image signal processor 220 signifies an integrated circuit that can process signals output from the binary CMOS image sensor 100.

According to example embodiments, a system on chip (SoC) may include the binary CMOS image sensor 100, the controller 210, and the image signal processor 220. According to example embodiments, the binary CMOS image sensor 100 and the image signal processor 220 may be packaged together into a single package. Alternatively, the image signal processor 220 may be embedded in the controller 210.

Figure 20:
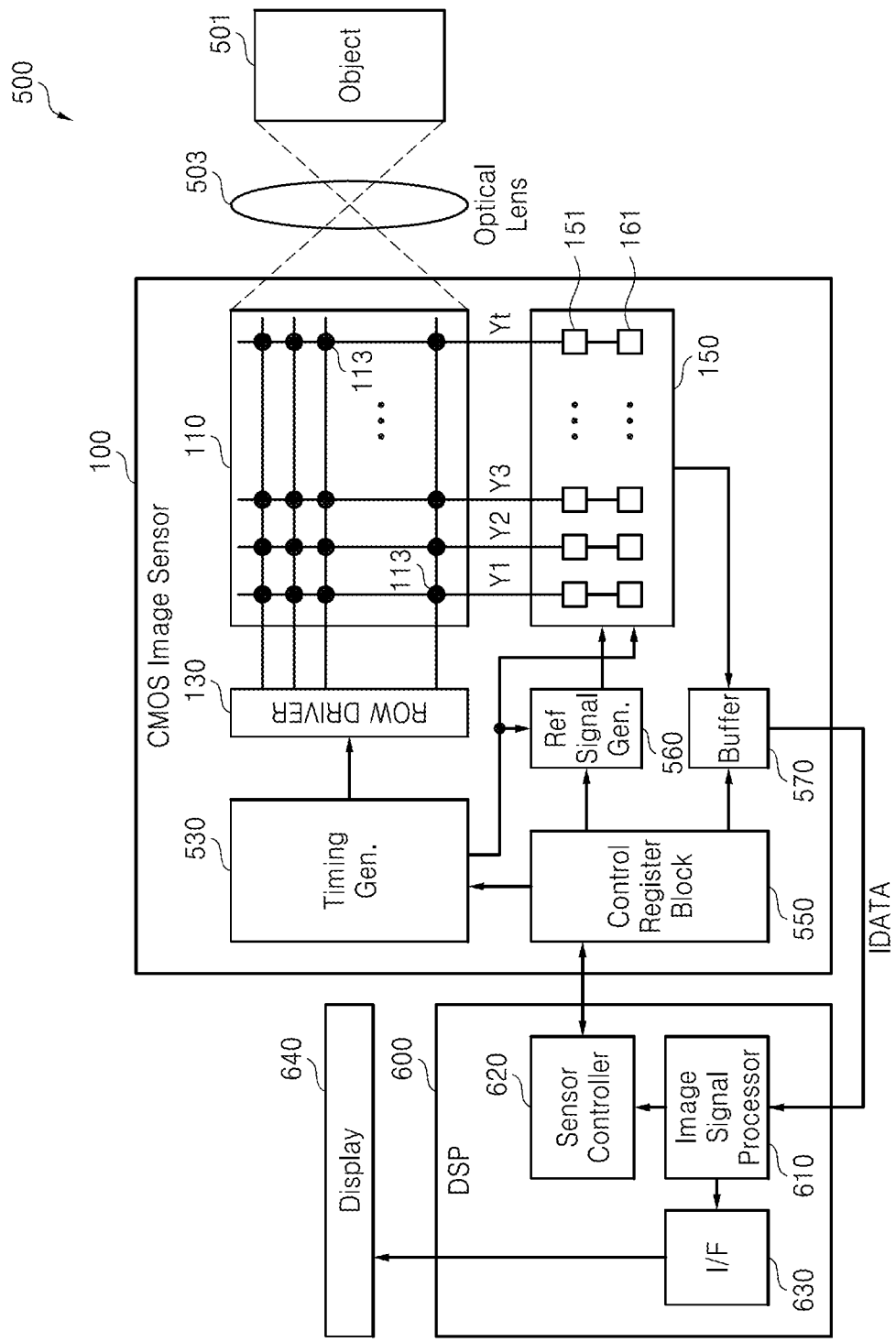
FIG. 20 is a block diagram of an image processing system including the CMOS image sensor illustrated in FIG. 1 according to other example embodiments of inventive concepts.

FIG. 20 is a block diagram of an image processing system 500 including the CMOS image sensor 100 illustrated in FIG. 1 according to other example embodiments of inventive concepts. Referring to FIGS. 1 through 20, the image processing system 500 may be implemented by the portable electronic device.

The image processing system 500 includes an optical lens 503, the CMOS image sensor 100, a digital signal processor (DSP) 600, and a display 640. The CMOS image sensor 100 generates image data IDATA corresponding to an object 501 picked up through the optical lens 503.

The CMOS image sensor 100 includes the pixel array 110, the row driver 130, the readout circuit 150, a timing generator 530, a control register block 550, a reference signal generator 560, and a buffer 570.

The pixel array 110 includes a plurality of the pixels 113. Each of the pixels 113 includes a plurality of sub-pixels 115A, 115B, 115C, or 115D (collectively denoted by 115). The pixels 113 are arranged in a matrix form in the pixel array 110.

The row driver 130 drives control voltages (e.g., Vs, Vd, Vg, and/or Vprog) for controlling the operation of the sub-pixels 115 to the pixel array 110 according to the control of the timing generator 530. The row driver 130 may function as a voltage generator that generates the control voltages (i.e., Vs, Vd, Vg, and/or Vprog). According to example embodiments, the control voltages (e.g., Vs, Vd, and/or Vprog) may be generated by a voltage generator other than the row driver 130.

The timing generator 530 controls the operations of the row driver 130, the readout circuit 150, and the reference signal generator 560 according to the control of the control register block 550.

The readout circuit 150 includes a comparator 151 for each column and a memory 161 for each column. The reference signal generator 560 controls the operations of the timing generator 530, the reference signal generator 560, and the buffer 570 according to the control of the DSP 600. The buffer 570 transmits the image data IDATA corresponding to a plurality of digital signals output from the readout circuit 150 to the DSP 600.

The DSP 600 includes an image signal processor 610, a sensor controller 620, and an interface (I/F) 630. The image signal processor 610 controls the I/F 630 and the sensor controller 620 that controls the control register block 550.

The CMOS image sensor 100 and the DSP 600 may be implemented together in a single package, e.g., a multi-chip package or package on package (POP). Alternatively, the CMOS image sensor 100 and the image signal processor 610 may be implemented together in a single package, e.g., a multi-chip package or PoP.

The image signal processor 610 processes the image data IDATA received from the buffer 570 and transmits processed image data to the I/F 630. The sensor controller 620 generates various control signals for controlling the control register block 550 according to the control of the image signal processor 610. The I/F 630 transmits the processed image data from the image signal processor 610 to the display 640.

The display 640 displays the image data received from the I/F 630. The display 640 may be implemented by a thin film transistor liquid crystal display (TFT-LCD), a light emitting diode (LED) display, an organic LED (OLED) display, an active matrix OLED (AMOLED) display, or a flexible display.

Figure 21:
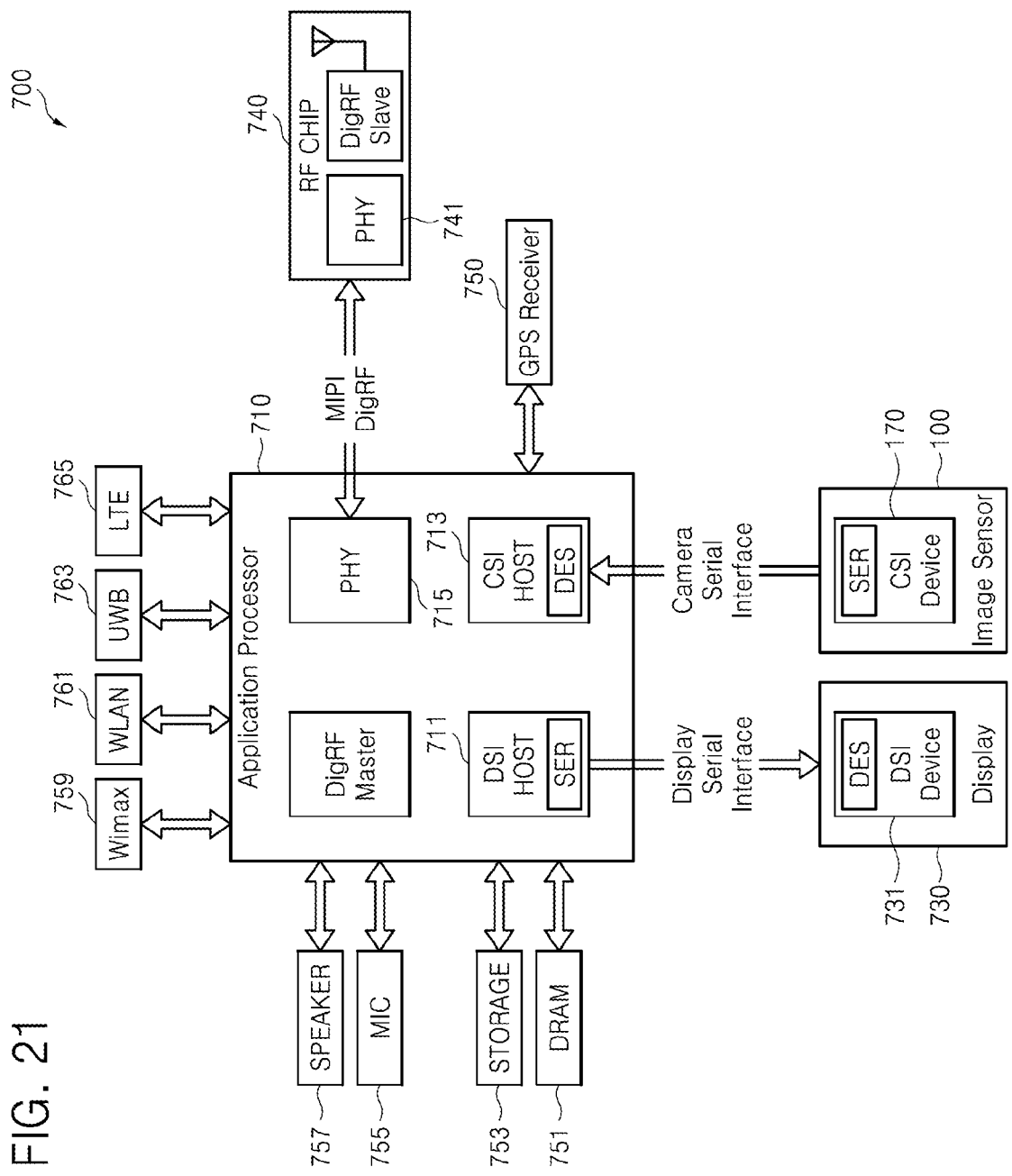
FIG. 21 is a block diagram of an image processing system including the CMOS image sensor illustrated in FIG. 1 according to further example embodiments of inventive concepts.

FIG. 21 is a block diagram of an image processing system 700 including the CMOS image sensor 100 illustrated in FIG. 1 according to further example embodiments of inventive concepts.

Referring to FIGS. 1 through 21, the image processing system 700 may be implemented as a portable electronic device that can use or support mobile industry processor interface (MIPI®)). The image processing system 700 may be implemented by an integrated circuit or a SoC.

The image processing system 700 includes an application processor 710, the CMOS image sensor 100, and a display 730. A camera serial interface (CSI) host 713 implemented in the application processor 710 may perform serial communication with a CSI device 170 included in the CMOS image sensor 100 through CSI. A deserializer DES and a serializer SER may be implemented in the CSI host 713 and the CSI device 170, respectively.

A display serial interface (DSI) host 711 implemented in the application processor 710 may perform serial communication with a DSI device 731 included in the display 730 through DSI. A serializer SER and a deserializer DES may be implemented in the DSI host 711 and the DSI device 731, respectively. The deserializer DES and the serializer SER may process electrical signals or optical signals.

The image processing system 700 may also include a radio frequency (RF) chip 740 communicating with the application processor 710. A physical layer (PHY) 715 of the application processor 710 and a PHY 741 of the RF chip 740 may communicate data with each other according to MIPI DigRF.

The image processing system 700 may also include a global positioning system (GPS) receiver 750, a memory 751 such as a dynamic random access memory (DRAM), a data storage device 753 implemented by a non-volatile memory such as a NAND flash memory, a microphone (MIC) 755, and/or a speaker 757. The image processing system 700 may communicate with external devices using at least one communication protocol or standard such as worldwide interoperability for microwave access (Wimax) 759, wireless local area network (WLAN) 761, ultra-wideband (UWB) 763, or long term evolution (LTE™) 765. The image processing system 700 may communicate with external devices using Bluetooth or WiFi.

Figure 22:
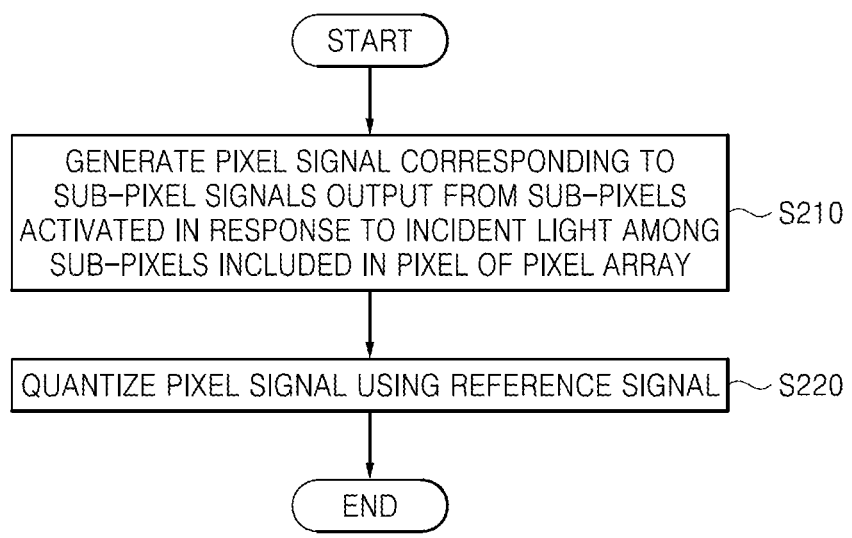
FIG. 22 is a flowchart of the operations of the CMOS image sensor illustrated in FIG. 1 according to some example embodiments of inventive concepts.

FIG. 22 is a flowchart of the operations of the CMOS image sensor 100 illustrated in FIG. 1 according to some example embodiments of inventive concepts. Referring to FIGS. 1 through 22, each pixel 113 in the pixel array 110 generates a pixel signal corresponding to sub-pixel signals output from respective sub-pixels activated in response to incident light among the sub-pixels 115 included in the pixel 113 in operation 5210.

A comparator 151 connected to each column line quantizes the pixel signal using the reference signal Ref and outputs the quantized signal Dout in operation 5220.

The sub-pixels 115 respectively illustrated in FIGS. 3, 6, 9, and 18 do not include a floating diffusion region, and therefore, the pixel including the sub-pixels 115 does not include the floating diffusion region unlike conventional pixels. The binary CMOS image sensor 100 including the sub-pixels 115 illustrated in FIGS. 3, 6, 9, and 18 is implemented as a backside-illuminated (BSI) CMOS image sensor.

As described above, according to some example embodiments of inventive concepts, a binary CMOS image sensor generates a quantized or digitized pixel signal regardless of the number of photons generated in sub-pixels. The binary CMOS image sensor is implemented as a non-volatile memory that performs photoelectric conversion. In addition, the binary CMOS image sensor reduces a readout time and an integration time and facilitates a global shutter.

While inventive concepts have been particularly shown and described with reference to example embodiments thereof, it will be understood by those of ordinary skill in the art that various changes in forms and details may be made therein without departing from the spirit and scope of inventive concepts as defined by the following claims.

What is claimed is:

1. A binary complementary metal-oxide-semiconductor (CMOS) image sensor comprising:
    a pixel array including at least one pixel having a plurality of sub-pixels; and
    a readout circuit configured to quantize a pixel signal output from the pixel based on a comparison between the pixel signal and a reference signal, the pixel signal corresponding to sub-pixel signals output from sub-pixels and being indicative of a number of the sub-pixels, from among the plurality of sub-pixels, activated in response to incident light; wherein
        the reference signal corresponds to a threshold number of sub-pixels;
        the readout circuit is further configured to generate the quantized pixel signal having a first value if the number of sub-pixels activated in response to the incident light is greater than the threshold number of sub-pixels, and to generate the quantized pixel signal having a second value if the number of sub-pixels activated in response to the incident light is less than or equal to the threshold number of sub-pixels.

2. The binary CMOS image sensor of claim 1, wherein a resistance value of each of the plurality of sub-pixels is determined based on a number of photons generated in response to the incident light.

3. The binary CMOS image sensor of claim 1, wherein each of the plurality of sub-pixels comprises:
    an epitaxial layer; and
    a non-volatile memory including a photoelectric conversion region configured to perform photoelectric conversion in response to incident light that has passed through the epitaxial layer.

4. The binary CMOS image sensor of claim 1, wherein each of the plurality of sub-pixels comprises:
    an epitaxial layer; and
    a floating gate transistor including a photoelectric conversion region configured to perform photoelectric conversion in response to incident light that has passed through the epitaxial layer.

5. The binary CMOS image sensor of claim 1, wherein each of the plurality of sub-pixels comprises:
    an epitaxial layer; and
    a nitride read-only memory (NROM) including a photoelectric conversion region configured to perform photoelectric conversion in response to incident light that has passed through the epitaxial layer.

6. The binary CMOS image sensor of claim 1, wherein each of the plurality of sub-pixels comprises:
    a photo-conductor and a source region in a semiconductor substrate;
    a drain region in the photo-conductor; and
    a gate electrode configured to receive a gate voltage.

7. The binary CMOS image sensor of claim 6, wherein each of the plurality of sub-pixels further comprises:
    a first connection line between the readout circuit and the source region;
    a second connection line connected to the drain region; and
    a third connection line connected to the photo-conductor.

8. An image processing system comprising:
    the binary CMOS image sensor of claim 1; and
    a controller configured to control operation of the binary CMOS image sensor.

9. The image processing system of claim 8, wherein each of the plurality of sub-pixels comprises:
    an epitaxial layer; and
    a non-volatile memory bonded to the epitaxial layer and including a photoelectric conversion region configured to perform photoelectric conversion in response to incident light that has passed through the epitaxial layer.

10. The image processing system of claim 8, wherein each of the plurality of sub-pixels comprises:
    a photo-conductor and a source region in a semiconductor substrate;
    a drain region in the photo-conductor;
    a gate electrode configured to receive a gate voltage;
    a first connection line between the readout circuit and the source region;
    a second connection line connected to the drain region; and
    a third connection line connected to the photo-conductor.

11. A method of operating a binary complementary metal-oxide-semiconductor (CMOS) image sensor including a pixel array, which includes at least one pixel having a plurality of sub-pixels, the method comprising:
    generating a pixel signal corresponding to sub-pixel signals output from sub-pixels, among the plurality of sub-pixels, activated in response to incident light; and
    quantizing the pixel signal based on a comparison between the pixel signal and a reference signal, the pixel signal being indicative of a number of the sub-pixels, from among the plurality of sub-pixels, activated in response to the incident light, and the reference signal corresponding to a threshold number of sub-pixels; wherein
        the quantized pixel signal has a first value if the number of sub-pixels activated in response to the incident light is greater than the threshold number of sub-pixels, and
        the quantized pixel signal having a second value if the number of sub-pixels activated in response to the incident light is less than or equal to the threshold number of sub-pixels.

12. The method of claim 11, wherein the pixel does not include a floating diffusion region.

13. The method of claim 11, wherein the generating the pixel signal comprises:
    performing photoelectric conversion in response to incident light that has passed through an epitaxial layer to generate the pixel signal.

14. The method of claim 11, wherein each of the plurality of sub-pixels comprises:
    a photo-conductor and a source region in a semiconductor substrate;
    a drain region in the photo-conductor;
    a gate electrode configured to receive a gate voltage;
    a first connection line between a readout circuit and the source region;
    a second connection line connected to the drain region; and
    a third connection line connected to the photo-conductor.

15. The method of claim 11, wherein a resistance value of each of the plurality of sub-pixels is determined based on the number of photons generated in response to the incident light.

16. A binary complementary metal-oxide-semiconductor (CMOS) image sensor comprising:
- a readout circuit configured to generate a quantized pixel signal for a pixel having a plurality of sub-pixels based on a comparison between a pixel signal for the pixel and a reference signal, the pixel signal being indicative of a number of sub-pixels, from among the plurality of sub-pixels, activated in response to incident light; wherein the reference signal corresponds to a threshold number of sub pixels,
- the readout circuit is further configured to generate the quantized pixel signal having a first value if the number of sub-pixels activated in response to the incident light is greater than the threshold number of sub-pixels, and to generate the quantized pixel signal having a second value if the number of sub-pixels activated in response to the incident light is less than or equal to the threshold number of sub-pixels.

17. The binary CMOS image sensor of claim 16, further comprising:
- a pixel array including the pixel.

18. The binary CMOS image sensor of claim 17, wherein the readout circuit is further configured to generate the quantized pixel signal based on a comparison between the number of sub-pixels activated in response to the incident light and the threshold number of sub-pixels.

19. The binary CMOS image sensor of claim 16, wherein the plurality of sub-pixels are connected to a common node, and wherein the readout circuit includes,
- a comparator configured to generate the quantized pixel signal based on a comparison between the pixel signal at the common node and the reference signal.

* * * * *